(12) United States Patent
Chandra et al.

(10) Patent No.: US 7,327,997 B2
(45) Date of Patent: Feb. 5, 2008

(54) HIGH ORDER TRANS-IMPEDANCE FILTER WITH A SINGLE OPERATIONAL AMPLIFIER

(75) Inventors: Gaurav Chandra, Bangalore (IN); Preetam Charan Anand Tadeparthy, Bangalore (IN); Prakash Easwaran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 490 days.

(21) Appl. No.: 10/711,724

(22) Filed: Sep. 30, 2004

(65) Prior Publication Data
US 2006/0068742 A1   Mar. 30, 2006

(51) Int. Cl.
*H04B 1/10* (2006.01)

(52) U.S. Cl. .................. 455/307; 455/341; 327/558; 327/553

(58) Field of Classification Search .......... 455/254, 455/296, 307, 311, 312, 341; 327/552, 558, 327/553, 554, 555, 556, 557
See application file for complete search history.

(56) References Cited

U.S. PATENT DOCUMENTS 6,201,438 B1 * 3/2001 Nicollini et al. ............ 327/558
6,529,068 B1 * 3/2003 Nicollini et al. ............ 327/552
6,816,004 B2 * 11/2004 Easwaran et al. ........... 327/552
2002/0101279 A1 * 8/2002 Greitschus et al. ......... 327/552
2005/0030092 A1 * 2/2005 Greitschus et al. ......... 327/552

* cited by examiner

*Primary Examiner*—Edward F. Urban
*Assistant Examiner*—Christian A. Hannon
(74) *Attorney, Agent, or Firm*—William B Kempler; W. James Brady, III; Frederick J. Telecky, Jr.

(57) ABSTRACT

A trans-impedance filter circuit provided according to an aspect of the present invention contains an operational amplifier, a first resistor, a first capacitor, a second resistor, and a second capacitor. The second capacitor is connected in parallel between the inverting input terminal and an output path of the operational amplifier. The second resistor is connected between the output terminal of the operational amplifier and a second node on a path connecting the input signal to the inverting input terminal. The first resistor is coupled between the first node and inverting input terminal of the operational amplifier. The first capacitor is coupled between the first node and Vss. Due to such connections, the filter circuit operates as a second order filter circuit, thereby providing a desired high level of filtering. Also, as the filter circuit is implemented with a single operational amplifier, the power and area requirements are reduced.

13 Claims, 8 Drawing Sheets

HIGH ORDER TRANS-IMPEDANCE FILTER WITH A SINGLE OPERATIONAL AMPLIFIER

RELATED APPLICATION

The present application is related to the co-pending application entitled, "Reducing Noise and Distortion in a River System", naming as inventors KAMATH et al, filed on even date herewith, serial No. 10/711,680, and is incorporated in its entirety herewith.

BACKGROUND OF THE INVENTION

1. Field of the Invention

The present invention relates to signal processing circuits, and more specifically to the design and implementation of a second order trans-impedance filter with a single operational amplifier.

2. Related Art

A general trans-impedance circuit generally refers to a circuit which generates a voltage level (on an output path) proportionate to the magnitude of an input current, as is well known in the relevant arts. A filter, implemented as a trans-impedance circuit, provides frequency selective transmission in addition to the current-voltage conversion.

Thus, a circuit or a component which operates as both a trans-impedance circuit and a filter can be referred to as a trans-impedance filter. By combining both filtering and conversion to voltage level into a single circuit/component, advantages such as reduction in area/space requirement and power consumption con be attained.

Trans-impedance filters can be used to process current signals in several scenarios. Examples of such scenarios include processing the output current of a current steering DAC or the output current of a down conversion mixer.

Filter circuits are generally implemented as second or higher order filters, since the higher order provides a desired high level of filtering. In addition, it is desirable to implement such filter circuits using a single operational amplifier, since the corresponding implementations would have reduced power and area requirements.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A trans-impedance filter circuit provided according to an aspect of the present invention contains an operational amplifier, a first resistor, a first capacitor, a second resistor, and a second capacitor. The second capacitor is connected in parallel between the inverting input terminal and an output terminal of the operational amplifier. The second resistor is connected between the output terminal of the operational amplifier and a second node on a path connecting the input signal to the inverting input terminal. The first resistor is coupled between the first node and inverting input terminal of the operational amplifier. The first capacitor is coupled between the first node and Vss.

Due to such connections, the filter circuit operates as a second order filter circuit, thereby providing a desired high level of filtering. In action, as the filter circuit is implemented with a single operational amplifier, the power and area requirements are also reduced.

Another aspect of the present invention provides a generalized version of a filter circuit, which can implement certain transfer functions that the above noted second order filter circuit can not implement. The above-noted second order filter circuit can be realized from the generalized version. The generalized version of the filter circuit is also described in further detail in sections below.

Several aspects of the invention are described below with reference to examples for illustration. It should be understood that numerous specific details, relationships, and method are set forth to provide a full understanding of the invention. One skilled in the relevant art, however, will really recognize that the invention can be practiced without one or more of the specific details, or with other method, etc. In other instances, well-known structures or operations are not shown in detail to avoid obscuring the invention.

2. Example System

Figure 1:
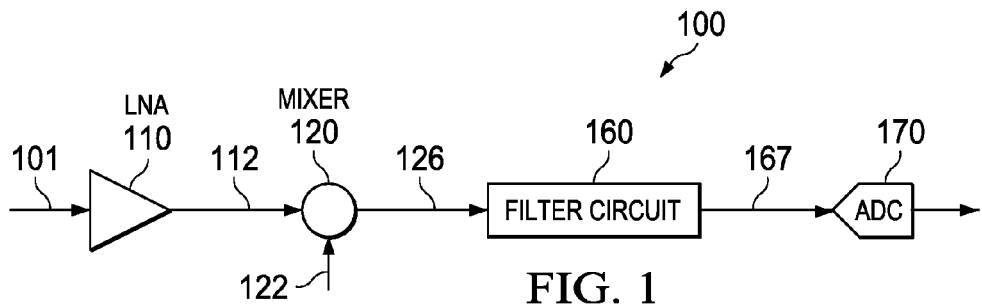
FIG. 1 is a block diagram of an example river system in which several aspects of the present invention are implemented.

FIG. 1 is a block diagram of river system 100 illustrating an example system in which various aspects of the present invention may be implemented. For illustration, it is assumed that river system 100 is implemented within a Wireless Load Area Network (WLAN) River. However, river system 100 can be implemented in other de/ices (wireless as well as wire-based communications) as well.

Receiver system 100 is shown containing low noise amplifiers (LNA) 110, mixer 120, filter circuit 160, and analog to digital converter (ADC) 170. Each block/stage is described in further detail below.

LNA 110 receives signals on path 101 and amplifies the reveal signals to generate a corresponding amplified signal on path 112. For example, in wireless systems, the signals that are transmitted from satellites, etc may be received by an antenna (not shown) and the received signals are provided on path 101. The received signals may be weak in strength and thus amplified by LNA 110 for further processing.

Mixer 120 may be used to down-convert the received amplified signal on path 112 into an intermediate signal with the frequency band of interest centered at a lower frequency than the carrier frequency of the received signal. In an embodiment, a signal with the frequency band of interest centered at 2.4 GHz (carrier frequency) is converted to a signal with the frequency band of interest centered at zero frequency.

Mixer 120 may receive the amplified signal on path 112 and a signal of fixed frequency on path 122 cs inputs, and provides the intermediate signal on path 126. The signal of fixed frequency on path 122 may be generated by a phase loaded loop (not shown) in a known way.

Filter circuit 160 may correspond to a low puss filter, which allows the desired low frequencies and rejects dl other unwanted high frequencies present in the signal revealed on line 126. The filtered signal, which contains the frequency band of interest, is provided on path 167. ADC 170 converts (samples) the filtered signal received on path 167 to a corresponding digital value, which represents the signal of interest in received signal 101. LNA 110 and ADC 170 may be implemented in a known way.

It may be noted that some of the components (for example mixer 120 and filter circuit 160) described above may introduce noise and distortion in received signal 101, which is undesirable.

An aspect of the present invention reduces such noise and distortion in the river systems by having mixer 120 provide the intermediate signal to filter circuit 160 in the form of electric current (as opposed to in voltage domain). In general, an output signal (here, intermediate signal) would be deemed to be generated in the form of electric current if the percentage of change/swing of the magnitude of electric current (of the output signal) is (substantially) more than the percentage of change of the magnitude of the voltage level (of the output signal) for the same change in an input signal.

It may be helpful to first understand the details of a prior mixer and filter circuit, which does not include one or more features of the present invention. Accordingly, prior mixer is described below first with reference to FIG. 2.

3. Prior Mixer

Figure 2:
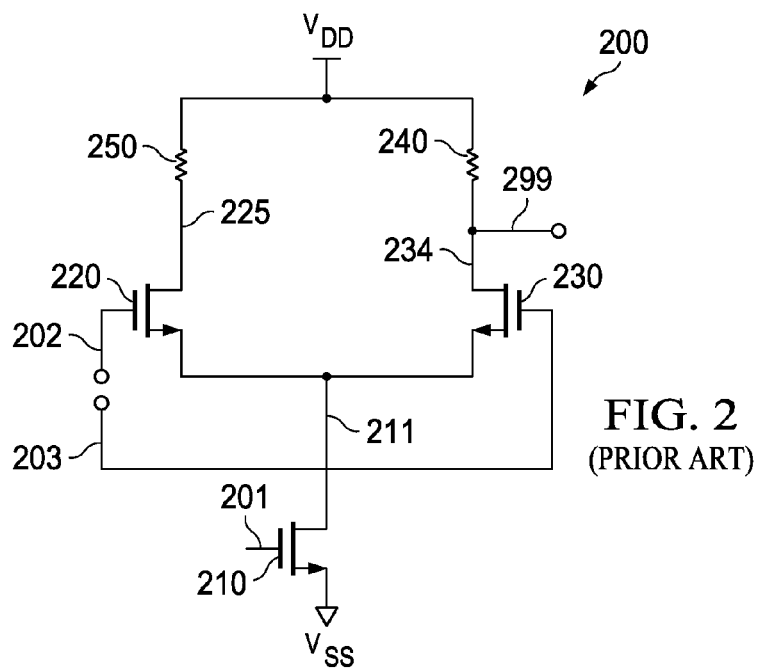
FIG. 2 is a circuit diagram illustrating the details of a mixer in one prior embodiment.

FIG. 2 is a circuit diagram illustrating the details of a mixer in one prior embodiment. Mixer 200 is shown containing NMOS transistors 210, 220 and 230, and resistors 240 and 250. Each component is described below.

As noted above, mixer 200 converts input signal received on path 201 into an intermediate signed with the frequency band of interest centered at a lower frequency than that of the input signal. Such a conversion may be performed by multiplying the input signal with a fixed frequency signal as is well known in relevant arts. The manner in which the multiplication operation is performed by the circuit of FIG. 2 is described below.

Transistors 210, 220 and 230 together operate to generate currents on paths 225 and 234, with each current representing the intermediate signed with a frequency band of interest centered at a lower frequency (0 in one embodiment). The currents are generated bused on input signed 201 and the fixed frequency signals received on paths 202 and 203. The signals on paths 202 and 203 are same in magnitude and opposite in phase. The manner in which the intermediate signal may be generated is described below.

Transistor 210 receives input signed 201 on the gate terminal and provides a current (on path 211) which is proportionate to the voltage level of input signal 201. Such an operation may be attained by implementing transistor 210 to operate as a current source.

Transistors 220 and 230 receive a fixed frequency signal on the respective gate terminals 202 and 203. Transistors 220 and 230 are turned on/off based on the voltage level of signals 202 and 203 respectively. Since signals 202 and 203 are opposite in phase, when one of transistors 220 and 230 is turned on, the other one is turned off. hen transistor 230 is on, current on path 234 equals the current on path 211 and when transistor 230 is off, no current flows on path 234. Therefore, it may be noted that the current on path 234 is controlled by signal 203 (which controls the operation o transistor 230) and signal 201 (which controls the current on path 211). Similarly, the current on path 225 is controlled by signals 202 and 201.

As a result, the currents on paths 225 and 234 represent the multiplication of input signal 201 with the fixed frequency signals 202 and 203 respectively. However, the frequency of the currents on paths 225 and 234 depends on the frequency of input signal and the fixed frequency signal.

In an embodiment, each of signals 202 and 203 is in the form of a square wave for ease of converting the input signal into the intermediate signal. A square wave may be viewed as containing multiple frequencies of sine wave signals. As a result, the current on paths 225 and 234 contains the intermediate signed with multiple sine wave signals of different harmonic frequency components including the frequency component (the component of interest) representing the difference of the carrier frequency of the input signal and the fundamental frequency of the fixed frequency signal (paths 202 and 203).

In the example embodiment noted above, the intermediate signal is generated with a lower frequency equaling zero by selecting the frequency of signals 202 and 203 equaling the center frequency (the frequency at which the frequency bond of interest is centered) of input signal 201.

Resistors 250 and 240 respectively convert electric currents 225 and 234 into corresponding voltage signals, which are required to interface with a prior filter circuit (described in sections below). The intermediate signal on path 299 is provided in the form of electric voltage to a filter circuit. The description is continued with reference to a prior filter circuit.

4. Prior Filter Circuit

Figure 3:
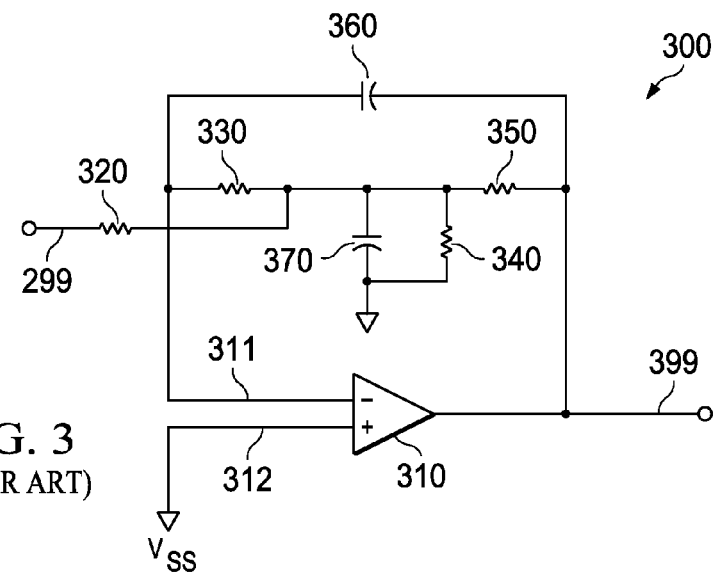
FIG. 3 is a circuit diagram illustrating the details of a filter circuit in one prior embodiment.

FIG. 3 is a circuit diagram illustrating the details of a filter circuit in one prior embodiment. Filter circuit 300 operates as a second order low pass filter (LPF) and is shown containing operational amplifier 310, resistors 320, 330, 340, and 350, and capacitors 360 and 370. Each component is described below.

Operational amplifier 310 receives the signal on path 311 at inverting input terminal through the path containing resistors 320 and 330. The non-inverting input terminal 312 is connected to ground to provide single ended operation. Operational amplifier 310 amplifies the signed at inverting input terminal 311 and provides the amplified signal on output path 399.

Resistors 320, 330, 340 and 350, and capacitors 360 and 370 together form a second order low puss filter circuit to allow only the frequency bond of interest and reject dl other frequency components in the signal received on path 299. Thus, filter circuit 300 may reject the unwanted interference signals in signal 299 and provides the filtered signal on path 399.

Assuming that the resistance of resistors 320, 330, 340 and 350 equal R4, R2, R1 and R3 respectively, and capacitances of capacitors 360 and 370 equal C2 and C1 respectively, the transfer function (H(s)) of filter circuit 300 is given by equation (1) below, wherein '*' and '+' respectively represent multiplication and addition arithmetic operations, and 's' represents jw in Laplace Domain.

$$H(s) = \frac{R_3}{R_4} \cdot \frac{1}{1 + sC_2 \cdot \left(R_3 + R_2 + \frac{R_3 R_2}{R_1} + \frac{R_3 R_2}{R_4}\right) + s^2 \cdot C_1 C_2 R_3 R_2} \quad \text{Equation (1)}$$

It may be observed that the gain of the filter circuit depends on ratio R3/R4. However, resistors R3 and R4, dong with other resistors (R1, R2) introduce noise in the signals of interest. The problems with prior mixer 200 and prior filter circuit 300 are described below with reference to FIG. 4.

5. Problems with Prior Embodiment(s)

Figure 4:
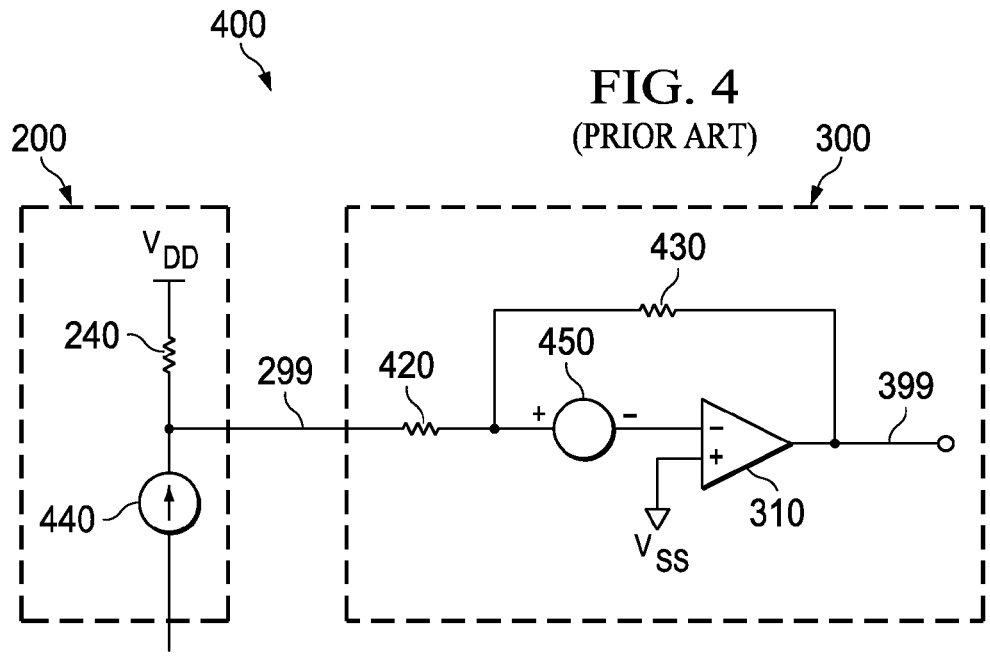
FIG. 4 is a logical diagram illustrating the noise/distortion caused by the combination of the mixer of FIG. 2 and filter circuit of FIG. 3 in an embodiment.

FIG. 4 is a circuit diagram containing a logical view of combination of mixer 200 and filter circuit 300 in an embodiment. Only some of the components in mixer 200 and filter circuit 300, as relevant to illustrate the problems are shown in circuit 400. In particular, various capacitors (which may otherwise be present) are not shown, and thus the logical diagram represents a circuit operating at low frequencies. Even though, the analysis that would be made bused on the logical diagram may not provide accurate results, the results were empirically found to be within 10-15% accuracy.

Mixer 200 is shown containing resistor 240 and current source 440. Current source 440 represents the current (In_mix) due to noise components in mixer 200. Filter circuit 300 is modeled as operating at a low frequency and thus capacitors 360 and 370 are not shown. It may be noted that resistors 320, 330, 340 and 350 are connected in a star fashion (connected to a single electrical node) and the delta equivalent (containing resistors 420 and 430) of the resistors is shown in FIG. 4. Accordingly, the values of resistors 420 and 430 respectively represented by Ra and Rb are given by Equations (2) and (3) below.

$$Ra = R2 + (R4 \| R1) + R2(R4 \| R1)/R3 \quad \text{Equation (2)}$$

$$Rb = R2 + R3 + R2R3/(R4 \| R1) \quad \text{Equation (3)}$$

wherein '‖' represents parallel connection between resistors of corresponding resistance values on both sides of '‖'. For example, $_4R\|R_1$ equals $R_4*R_1/(R_4+R_1)$.

Voltage source 450 represents the noise introduced by operational amplifier 310. The output voltage on path 399 due to noise components in circuit 400 is given by equation (4) below.

$$V_n^2 = \left(\frac{i_{n,mix} R_b R_L}{R_a + R_L}\right)^2 + v_{n,amp}^2\left(1 + \frac{R_b}{R_a + R_L}\right)^2 + 4kTR_b\left(1 + \frac{R_b}{R_a + R_L}\right) \quad \text{Equation (4)}$$

wherein $R_L$ represents the resistance of resistor 240, k is Boltzman's constant (well known in the relevant arts), and T is ambient/room temperature in absolute/Kelvin sode.

It may be appreciated that Equation (4) has three components separated by the + signs, and first component, second component and third component respectively represent the noise voltages due to mixer 200, operational amplifier 300 and resistors in filter circuit 300. It may be noted that the signed on path 299 is in the form of electric voltage and resistor 420 ($R_a$) converts voltage 299 into the corresponding electric current for proper operation of filter circuit 300. $R_a$ needs to be large to interface with mixer 200 (which provides a signed in the form of voltage on path 299) since a low value of $R_a$ may cause loading effect on mixer 200 resulting in (undesirable result of) reduction of voltage level of voltage 299. A high value of Ra in turn increases the noise level since several resistors in a filter circuit may also need to be scaled up correspondingly.

The ratio $R_b/R_a$ represents the gain of filter circuit 300 of FIG. 4, which is fixed based on the gain requirement of the filter circuit at the specific operation time instance. Therefore, by serving components 2 and 3 of Equation (4), it may be observed that the noise due to operational amplifier 300 and resistors in the filter circuit is amplified by the gain of the filter circuit, further resulting in increase of the noise when a higher gain is sought, which is undesirable. Hence, one problem with prior filter circuit 300 is the introduction of noise in the filtered signal provided on path 399.

The noise due to resistors can be reduced by reducing the resistance values of resistors 420 and 430. However, to maintain the desired response of the filter, the reduction in resistance values requires on increase in the capacitance values of capacitors in filter circuit 300 of FIG. 3, which leads to increased area requirement and fabrication challenges. There is often also a limit to which resistance values can be reduced based on loading seen by mixer 200. Therefore, reducing resistance values may not be desirable, at least in some environments.

Alternatively, the effect of noise due to resistors 420 and 430 can be minimized by providing a signal with a high voltage swing on path 299. Due to such a high swing for the input signal, the strength of signal components can be made to be substantially more than the strength of the noise components, thereby causing the noise due to high resistance values to be negligible.

However, one problem with mixer 200 with the generation of high voltage swing signals on path 299 is that transistors 220 and 230 of FIG. 2 may provide a non-linear response while processing signals with such a high voltage swing. The non-linear response would in turn cause distortion in the signal provided on path 299. The distortion in the signal would be worse if mixer 200 is implemented to operate at low supply voltages. However, there are several environments in which low supply voltages are desirable. Accordingly, use of high voltage swing on path 299 may be in bate in some environments.

The manner in which one or more of the problems with prior mixer and filter circuit can be addressed according to various aspects of the present invention is described below.

6. Modifying Prior Circuits for Low Noise/Distortion

An improvement to the combination of the mixer and filter circuit is bused on an observation that a current to voltage conversion and then again a voltage to current conversion is performed in the combination circuit of FIG. 4. The current to voltage conversion is performed by resistor 240, and the voltage to current conversion is performed by resistor 420. A current mode interface is provided between a mixer and a filter circuit according to an aspect of the present invention, which enables removed of resistor 240 in mixer 200 and resistor 420 in filter circuit 300. By removing resistor 420 (which is a source of the noise), noise introduced by the filter circuit con be reduced.

In auction, as current on path 234 is directly provided to the filter circuit, the requirement of large voltage swing on path 299 may be eliminated. The absence of large voltage swing on path 299 reduces distortion in the signals of interest. Thus, low noise and low distortion can be attained by using a current mode interface between the mixer and the filter circuit (As described with examples below).

However, removed of resistor to provide current mode interface in filter circuit may require redesign of the filter circuit at least to meet various parameters (Q-factor, frequency response, etc.,) as desirable.

The redesign may need to take into aunt other requirements as well. For example, an ideal current mode input circuit (i.e., filter which receives the current input) has to offer zero input impedance. Accordingly, it is desirable to implement the filter circuit (at least a first stage of the filter circuit) with a low input impedance to receive current from the mixer. Example mixer-filter circuits which meet some of such requirements are described below in further detail.

7. Combination of Mixer and Filter Circuit

Figure 5A:
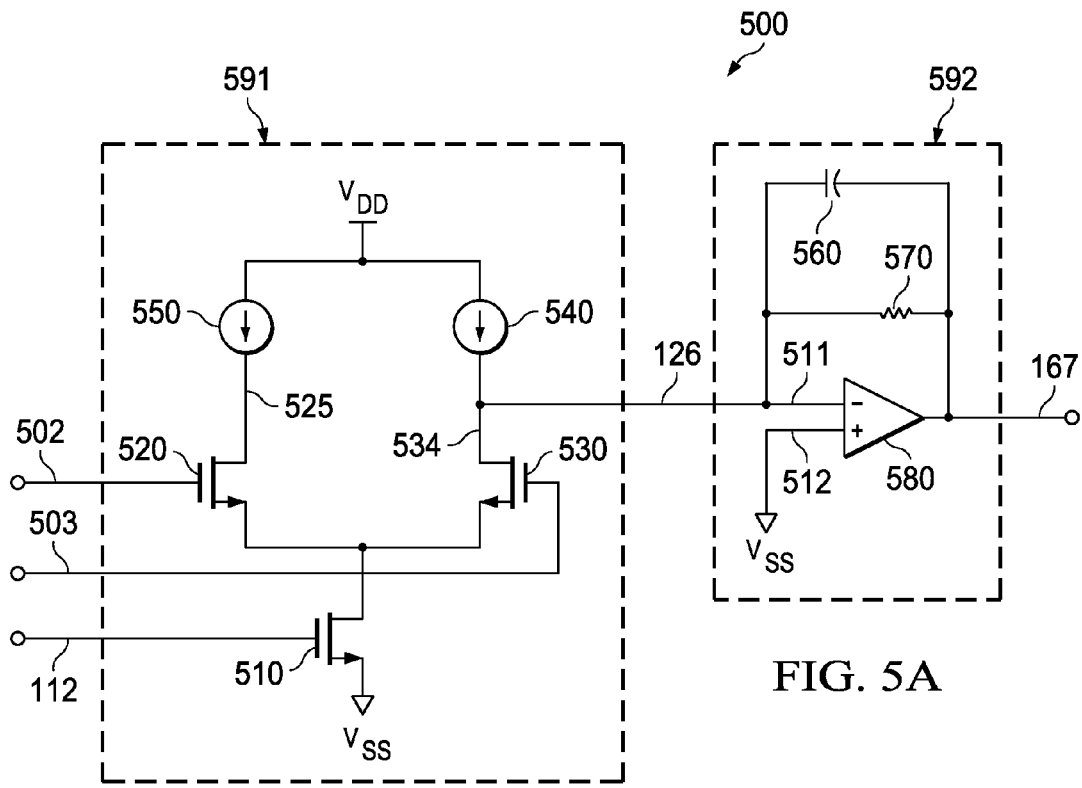
FIG. 5A is a circuit diagram implemented in single-ended mode illustrating the details of a combination of a mixer and a filter circuit in an embodiment of the present invention.

FIG. 5A is a circuit diagram illustrating the details of a combination of mixer and filter circuit implemented for single-ended mode of operation in an embodiment of the present invention. Mixer-filter circuit 500 is shown containing mixer 591 and filter circuit 592. Mixer 591 is shown containing NMOS transistors 510, 520, and 530, and current sources 540 and 550. Filter circuit 592 is shown containing capacitor 560, resistor 570 and operational amplifier 580. Each component is described below.

Mixer 591 is assumed to operate from input 112 and filter circuit 592 is assumed to operate from input 126 generated by mixer 591. Thus, the combination of mixer 591 and filter circuit 592 can be used in place of the combination of mixer 120 and filter circuit 160 of FIG. 1. As noted above, mixer 591 converts input signed received on path 112 into an intermediate signal in the form of electric current with the frequency band of interest centered at a lower frequency than that of the input signal, and provides the electric current on path 126. The conversion may be performed by using fixed frequency signals on paths 502 and 503. Signals 502 and 503 are similar to signals 202 and 203 of FIG. 2. Paths 502 and 503 are contained in path 122 of FIG. 1.

Current sources 540 and 550 provide the current to set bias point for linear operation of transistors 510, 520 and 530. The magnitude of the current source may be determined accordingly. The determination of the magnitude and the implementation of current sources will be apparent to one skilled in the relevant arts. The common mode voltage between mixer 591 and filter circuit 592 is set by a common mode feed back loop (not shown) as is well known in relevant arts. For example, the common mode voltage is set to bis current sources 540 and 550, and operational amplifier 580 optimally.

One terminal of each of current sources 540 and 550 is connected to supply Vdd and the other terminal of each of current sources 540 and 550 is connected to the drain terminal of transistors 530 and 520 respectively. Transistors 530 and 520 receive fixed frequency signals on the respective gate terminals 502 and 503. The source terminals of each of transistors 530 and 520 is connected to the drain terminal of transistor 510. Transistor 510 receives input signal 112 on the gate terminal and the source terminal of transistor 510 is connected to Vss or ground.

Transistors 510, 520, and 530 of mixer 591 operate similar to transistors 210, 220 and 230 of FIG. 2. For conciseness, the description of the components is not repeated. Due to the operation of transistors 510, 520, and 530, the current provided on path 534 represents intermediate signal 126, which is provided as input to filter circuit 592.

Operational amplifier 580 is shown with inverting input terminal 511 connected to receive signal on path 126 and non-inverting input terminal 512 connected to Vss or ground. Resistor 570 and capacitor 580 are connected in parallel between inverting input terminal 511 and output terminal of operational amplifier 580 on path 167.

Operational amplifier 580 receives the signal on path 126 at inverting input terminal. Non-inverting input terminal 512 is connected to ground to provide single ended operation. Operational amplifier 580 amplifies the signal at inverting input terminal 511 and provides the amplified signal on output path 167.

Resistor 570 and capacitor 560 together form a first order low pass filter to allow only the frequency band of interest and reject dl frequency components other than the frequency band of interest in the signal received on path 126. By appropriate selection of the component values of resistor 570 and capacitor 560 based on the desired corner frequency (which separates the frequency band of interest from the frequency components sought to be rejected), unwanted interference signals may be rejected effectively.

Thus, filter circuit 592 may reject the unwanted interference signals in signal 126 and provides the filtered signal on path 167, which contains the frequency band of interest centered at lower frequency. Filter circuit 592 provides filtered signal 167 in the form of electric voltage even though the input signal received on path 126 is in the form of current.

As noted above, filter circuit 592 needs to provide zero input impedance for current mode interface. It may be served that the input impedance of filter circuit 592 is zero/low since no components are present between path 126 and inverting input terminal 511. Thus, filter circuit 592 performs filtering operation on intermediate signed 126 received in the form of electric current.

It may be noted that resistors (such as 420 of FIG. 4) are eliminated in filter circuit 592, thus the noise introduced by filter circuit 592 is reduced. The output voltage ($Vn^2$) on path 167 due to various noise components in circuit 500 is given by equation (5) below.

$$V_n^2 = (i_{n,mix}R_f)^2 + v_{n,amp}^2 + 4kTR_f \qquad \text{Equation (5)}$$

wherein $R_f$ represents the resistance value of resistor 570.

It may be appreciated from equation (5) that noise due to operational amplifier 580 and resistor 570 is not amplified and thus the noise is reduced compared to the noise of FIG. 4 as given with equation (4) above.

Further, the effect of noise (due to filter circuit 592) may be reduced by increasing the amplification factor of mixer 591 since the current on path 126 can be amplified substantially. As a result, the effect of noise on the large current signal 126 may be reduced. In addition, due to the current mode interface between mixer 591 and filter circuit 592, voltage swing of intermediate ae signal 126 can be kept small and thus distortion due to non-linearity of transistors in mixer 591 may be reduced.

Also, strong interference signals may not affect the processing of signals of interest since strong (in voltage domain) interference signals are not further amplified in mixer 591 before providing intermediate signal 126 to filter circuit 592. However, filtered signal 167 is provided with large voltage swing (as desirable for the operation of ADC 170), which contains only signals of interest.

Figure 5B:
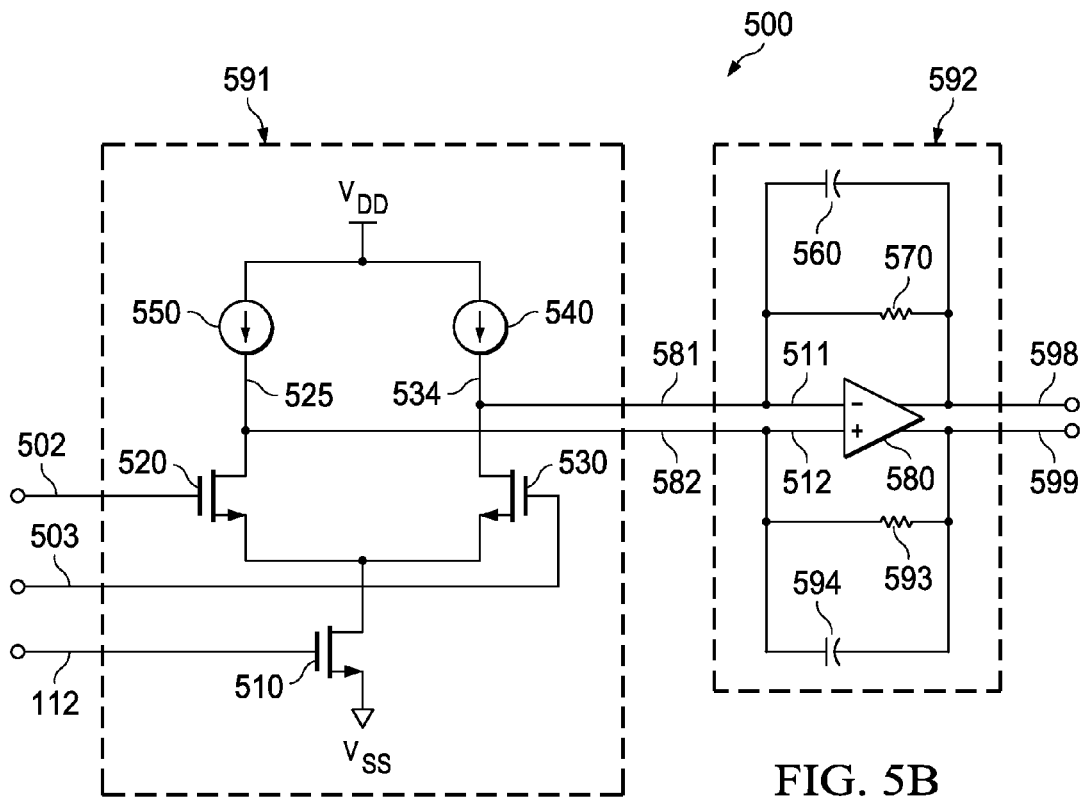
FIG. 5B is a circuit diagram implemented in differential mode illustrating the details of a combination of a mixer and a filter circuit in an embodiment of the present invention.

FIG. 5B represents the filter circuit 500 of FIG. 5A implemented in differential mode. Resistor 593 (operating in complementing position to resistor 570 for differential operation) and capacitor 594 (operating in complementing position to capacitor 560) are shown added to provide the differential mode of operation. In addition, the differential inputs 581 and 582 (generated by mixer 591) may be viewed as logically contained in path 126 of FIG. 1. The output signals 598 and 599 may be viewed as logically contained in path 167 of FIG. 1.

It may be noted that filter circuits of FIGS. 5A and 5B are single order filters, which may not provide sharp frequency characteristics at cutoff frequency to reject interference signals. The interference signals due the absence of such sharp frequency characteristics can get amplified and presented at the output of filter circuit 592. Accordingly, a trans-impedance filter circuit of higher order, which overcame some of such problems, is described below with reference to FIGS. 6A and 6B.

8. Second Order Trans-Impedance Filter Circuit

Figure 6A:
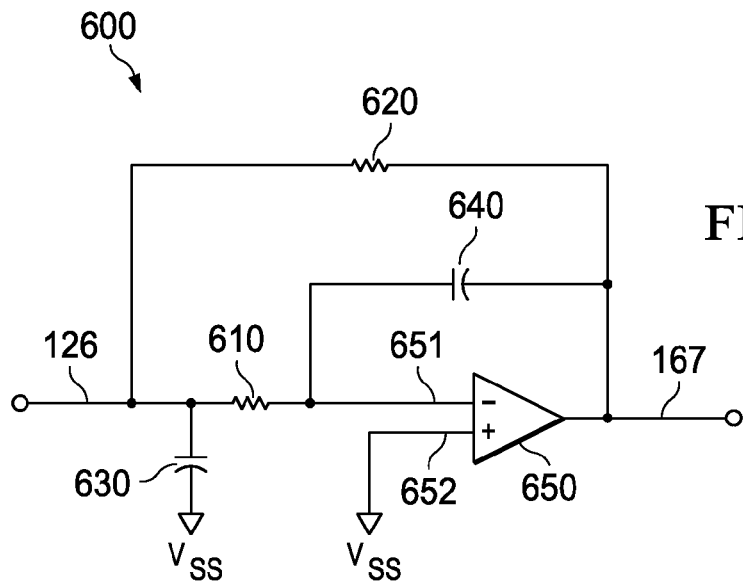
FIG. 6A is a circuit diagram implemented in single-ended mode illustrating the details of a second order filter circuit in an embodiment of the present invention.

FIG. 6A is a circuit diagram illustrating the details of a second order trans-impedance filter circuit implemented for single-ended operation in an embodiment of the present invention. Filter circuit 600 is assumed to operate from input 126 generated by mixer 591 of FIG. 5A. Thus, the combination of mixer 591 and filter circuit 600 con be used in place of the combination of mixer 120 and filter circuit 160 of FIG. 1. Filter circuit 600 is shown containing resistors 610 and 620, capacitors 630 and 640, and operational amplifier 650. Each component is described below.

Intermediate signal 126 is shown provided to inverting input terminal 651 of operational amplifier 650 via resistor 610. One end of capacitor 630 is connected to receive the intermediate signal on path 126 and the other end is connected to Vss/ground. Resistor 620 is connected between path 126 and output terminal 167 of operational amplifier 650. Capacitor 640 is connected between inverting input terminal 651 and output terminal 167 of operational amplifier 650.

Operational amplifier 650 receives input signal 126 on path 651 on the inverting input terminal, as noted above. The non-inverting input terminal 652 is connected to ground to provide single ended operation. Operational amplifier 650 amplifies the signal at inverting input terminal 651 and provides the amplified signal on output path 167.

Resistors 610 and 620, capacitors 630 and 640 together form a second order low pass filter circuit to allow only the frequency band of interest and reject all other frequency components in the signal received on path 126. Thus, filter circuit 600 may reject the unwanted interference signals in signal 126 and provides the filtered signal on path 167.

The input signal 126 to filter circuit 600 is in the form of electric current (Iin) and filtered signal 167 is in the form of electric voltage (Vo). Assuming that the resistance of resistors 610 and 620 equal R and Rf, and capacitances of capacitors 630 and 640 equal C1 and C2 respectively, the transfer function of filter circuit 600 is given by equation (6) below.

$$\frac{V_o}{I_{in}} = \frac{R_f}{1 + sC_2 \cdot (R_f + R) + s^2 \cdot C_1 C_2 R_f R} \qquad \text{Equation (6)}$$

It may be noted from equation (6) that the transfer function contains '$s^2$' term, which represents second order filter. It may be further noted that the transfer function (Equation (6)) of filter circuit 600 is similar to the transfer function (Equation (1)) of filter circuit 300. Thus, filter circuit 600 operates a second order low pars filter (LPF), which provides sharper frequency characteristics than a singe order filter as is well known. Filter circuit 600 can be implemented to operate in differential mode also, as described below with reference to FIG. 6B.

Figure 6B:
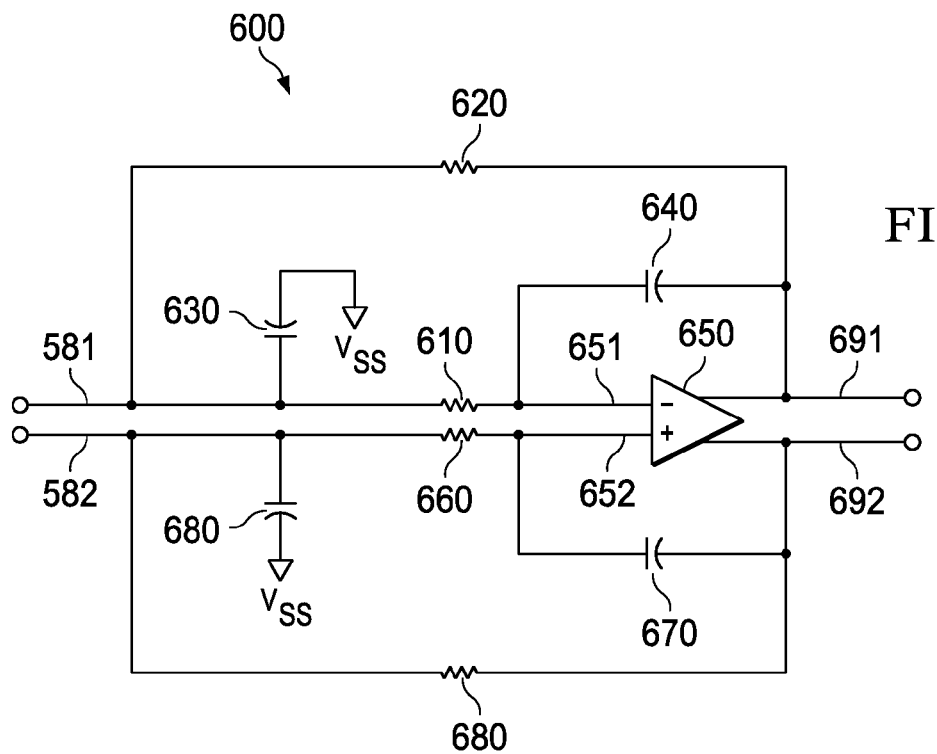
FIG. 6B is a circuit diagram implemented in differential mode illustrating the details of a second order filter circuit in an embodiment of the present invention.

In comparison to FIG. 6A, the circuit of FIG. 6B contains resistor 660 (operating in complementing position to resistor 610 for differential operation), resistor 680 (operating in complementing position to resistor 620), capacitors 680 (operating in complementing position to capacitors 630) and capacitor 670 (operating in complementing position to capacitor 640) in addition. The input signals 581 and 582 are assumed to be generated by mixer 591 of FIG. 5B. The output signals 691 and 692 may be viewed as logically contained in path 167 of FIG. 1.

Filter circuit 600 offers low input impedance to provide current mode interface to mixer 591, in spite of the presence of resistor 610. A low frequencies, the impedance is nearly zero because the capacitors 630 and 640 do not conduct many current, and therefore the current that flows through resistor 610 is (dose to) zero, due to virtual ground of the operational amplifier on inverting input terminal 651. However, at intermediate frequencies the input impedance depends on the capacitors 630 and 640, as these conduct some current. Thus, the input impedance depends on the frequency of the intermediate signal 126 (or combination of 581 and 582). However, it is still low compared to the embodiments of FIG. 3, as described in further detail below with reference to FIG. 7.

9. Impedance Characteristics

Figure 7:
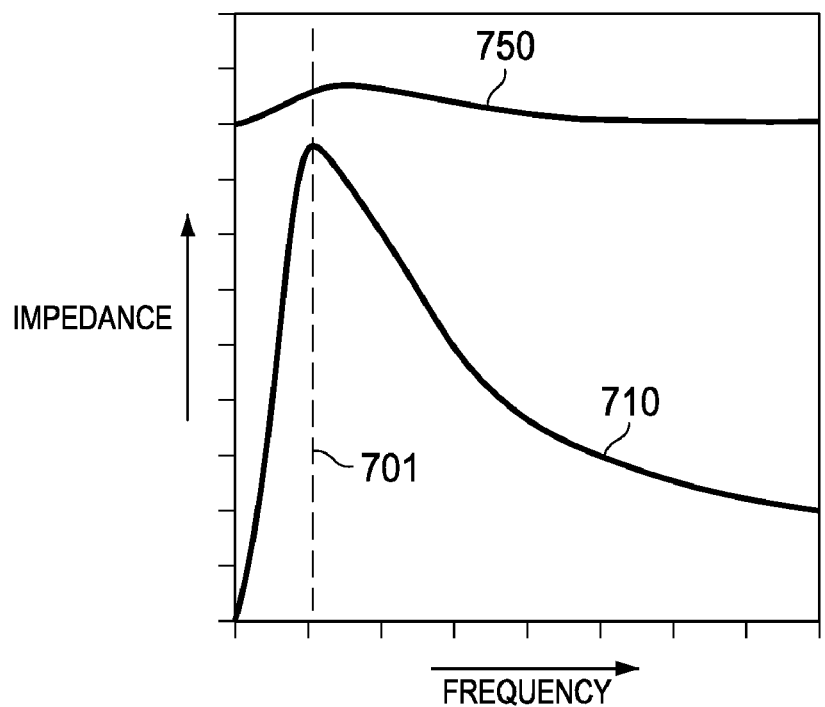
FIG. 7 is a graph illustrating the impedance characteristics of a second order filter with the frequency values shown on X-avis and the input impedance value shown on Y-axis in an embodiment of the present invention.

FIG. 7 is a graph illustrating impedance characteristics of example embodiments of filter circuit 600 of FIGS. 6A/6B (line 710) and filter circuit 300 of FIG. 3 (line 750), with the frequency values shown on X-avis and input impedance shown on Y-axis. It may be observed that the input impedance of filter circuit 600 is generally lower than that of filter circuit 300 for similar frequencies, by comprising lines 710 and 750.

In one embodiment (described in further detail in section 10 below), peak input impedance (i.e., maximum values on lines 750 and 710) of filter circuits 300 and 600 respectively equal 600 ohms and 450 ohms. Metrics such as average would more accurately reflect the advantages of various aspects of the present invention. The average value from line 710 would be substantially lower than that of line 750, representing the benefits of the embodiment(s) represented by FIG. 7. In one embodiment, the average input impedance of filter circuits 300 and 600 respectively equal 250 ohm and 650 ohms.

Line 710 represents the change in input impedance value for various frequencies. It may be noted that the input impedance value is maximum at one frequency. The frequency corresponding to maximum input impedance value is referred to as the corner frequency (cutoff frequency) and is shown by 701, which differentiates the frequency band of interest from the undesirable frequencies in the received signal.

The change in input impedance is due to capacitors 630 and 640 as the impedance value of capacitor 630 depends on the frequency of input signal received on path 126. It may be served that the input impedance value drops substantially low for frequencies other than for the corner frequency, especially in frequency band of interest.

It may be appreciated that even though the input impedance changes with the frequency, the value of the input impedance is low compared to the input impedance of filter circuit 300 of FIG. 3. However, it may be noted that the input impedance of filter circuit 592 of FIGS. 5A/5B is low (almost zero) and is independent of the frequency of input signal 126 to the extent operational amplifier 580 is ideal.

The description is continued with respect to comparison of noise characteristics (between the prior embodiments and the embodiments provided according to various aspects of the present invention, described above) with reference to FIG. 8 below.

10. Comparison of Noise Characteristics

Figure 8:
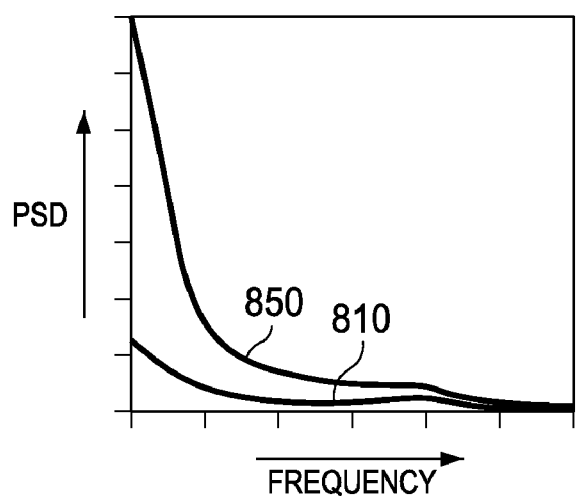
FIG. 8 is a graph comprising the noise characteristics of embodiments of prior at with the example embodiments according to various aspects of the present invention.

FIG. 8 is a graph illustrating noise characteristics with the frequency values shown on X-axis and the corresponding noise power spectral density (PSD) (representing distribution of noise power over a frequency bend) shown on Y-axis. Lines 810 and 850 represent the noise characteristics of filter circuits 300 and 600 respectively (in one embodiment).

It may be observed that both lines 810 and 850 are shown decreasing in noise value with the increase in frequency. However, line 810 is shown with low noise value than line 850 for any specific frequency of operation.

In one embodiment, mixer 200 is implemented with a DC load of 500 ohms, and filter circuit 300 is implemented with a corner frequency of 11.5 MHz (Mega hertz), pole-Q of 0.64 and the dc gain of 12 dB, the component values of filter circuit 200 found to be R2=750 ohms, R3=6 Kohms, R4=1.5 kohms, c1=19.1 pF (pico Farads), C=2.2 pF, and R1 is assumed to be open circuited for simplification of the analysis. It is observed that mixer-filter combination of FIG. 4 (prior embodiments) with the above component values lead to a noise figure (providing a measure of the degradation in the signal to noise ratio, as is well known in the relevant arts) of 4.5 dB.

However, the combination of mixer 591 and filter circuit 600 can be implemented to meet the parameters noted above with the component values of R=500 ohms, Rf=4 k ohms, C1=19.8 pF and C=4.8 pF. It is observed that the combination leads to a noise Figure of 3.3 dB, which is on improvement in there reduction of noise of 1.2 dB. Thus, filter circuit 600 of FIGS. 6A/6B according to on aspect of the present invention provides low noise PSD than filter circuit 300 of FIG. 3 in one prior embodiment.

It may be appreciated that various modifications may be made to the circuits of FIGS. 6A and 6B, without departing from the scope and spirit of various aspects of the present invention. The description is continued with respect to a general filter structure, according to an aspect of the present invention.

11. General High Order Filter Circuit

One limitation of the circuits of FIGS. 6A and 6B is that the transfer function is constrained to be on dl-pole transfer function. An dl-pole transfer function is one where the numerator does not have may "s" terms, and is hence frequency independent. A number of useful filters (for example Elleptical filter), well-known to one skilled in relevant arts, cannot be synthesized with this limitation.

Figure 9A:
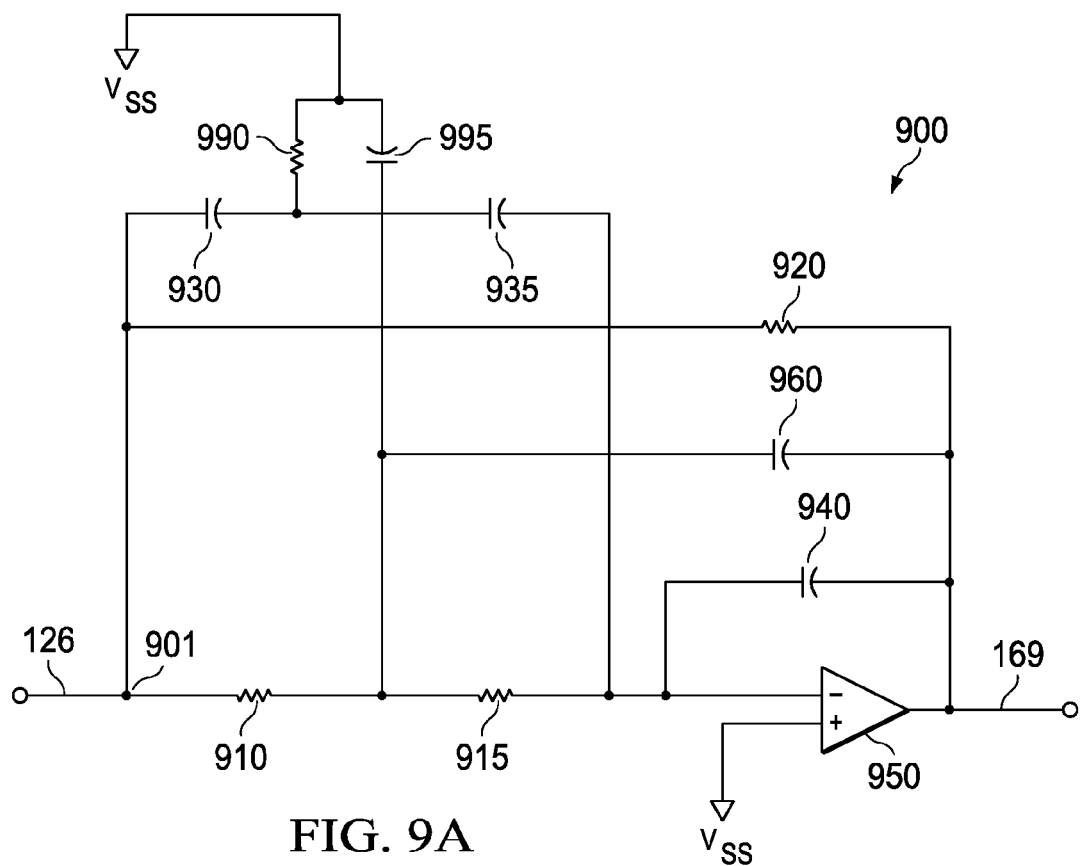
FIG. 9A is a circuit diagram illustrating a general form of the filter circuit in single-ended mode according to an aspect of the present invention.

FIG. 9A is a circuit diagram illustrating the details of a general high order filter circuit 900 provided according to an aspect of the present invention. Filter circuit 900 con be used in place of filter circuit 160 for the synthesis of more general class of filters. Filter circuit 900 is shown containing resistors 910, 915, 920, and 990, capacitors 930, 935, 940, 960 and 995, and operational amplifier 950. Each component is described below.

The combination of resistors 910 and 915 connected in series, couples the input signal reveal at node 901 (on path 126) to the inverting input terminal of operational amplifier 950. Resistor 920 is connected between the output terminal of operational amplifier 950 and node 901. Capacitor 940 is connected across the output terminal and inverting input terminal of operational amplifier 950. Capacitor 960 is connected between the junction of connection of resistors 910 and 915, and the output terminal of operational amplifier 950.

The combination of capacitors 930 and 935 connected in series, is connected between the inverting input terminal of operational amplifier 950 and node 901. Resistor 990 is connected between the junction of capacitors 930 and 935, and ground. Capacitor 935 is connected between ground and the junction of resistors 910 and 915.

In an embodiment, each of capacitors 930 and 935 has a capacitance magnitude equaling C, and capacitors 925 and 960 respectively have capacitance of 2 k(1–ë)C and 2 kCë (the four factors being multiplied). Resistors 910, 915, and 990 respectively have resistance of R, R and kR/2. The (feedback) capacitance of capacitor 940 is represented by Cf and the resistance of resistor 920 is represented by Rf. With these values and convention, the transfer function of filter circuit 900 is given by Equation (7) below:

$$\frac{V_o}{I_{in}} = \frac{R_f(s^2 C^2 k R^2 + 1)}{1 + A_1 s + A_2 s^2 + A_3 s^3} \qquad \text{Equation (7)}$$

Wherein, $$A_1 = 2RCk\lambda + 2RC_f + 2R_f Ck\lambda + R_f C_f$$

$$A_2 = 2R_f RC_f C(k+1) + R^2 C^2 k + 2C_f CR^2 k + 2R_f RC^2 k\lambda$$

$$A_3 = C^2 C_f R^2 R_f k$$

It may be observed that filter circuit 900 provides a third order transfer function in the denominator. However, it can be shown that the third (red) pole is usually at a much higher frequency than the two complex poles for typical values. Accordingly, in practice, the circuit of FIG. 9A provides second order filter characteristics.

Figure 9B:
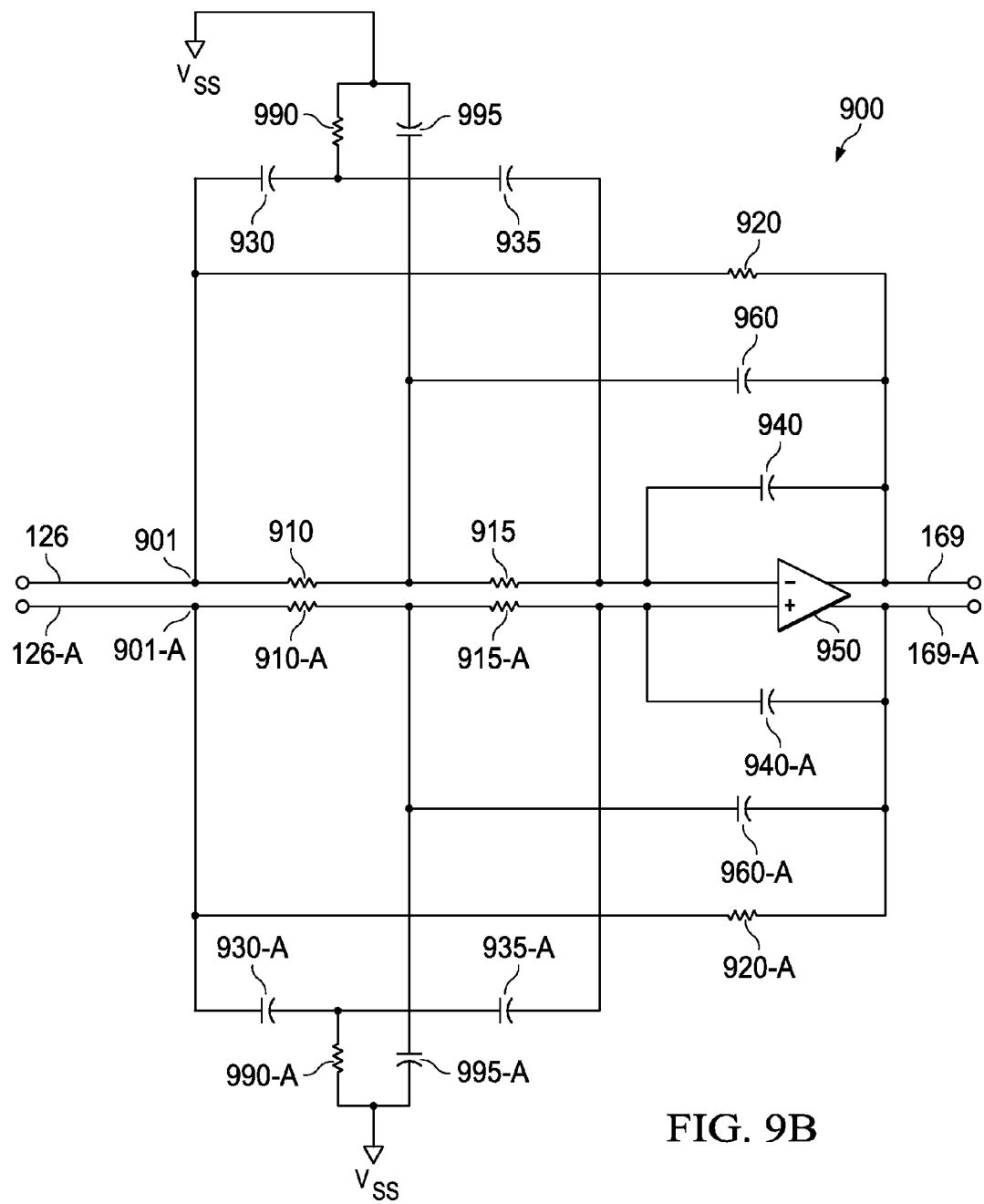
FIG. 9B is a circuit diagram illustrating a general form of the filter circuit in differential mode according to an aspect of the present invention.

Similar to in FIG. 6B, the single ended approach of FIG. 9A cm be extended to differential implementation as well, and the corresponding circuit is depicted in FIG. 9B. In comparison to FIG. 9A, FIG. 9B contains resistors 910-A, 915-A, 920-A and 990-A, capacitors 930-A, 935-A, 940-A, 960-A and 995-A and paths 126-A and 169-A in auction, which respectively provide the complementary operation to resistors 910, 915, 920, and 990, capacitors 930, 935, 940, 960 and 995, and paths 126 and 169, as required for the differential operation.

The parameter values k and ë, and the ratio Cf/C can be varied to achieve the desired corner frequency and pole Q-factor. The corresponding component values can be approximately calculated by ignoring the $S^3$ term of Equation 7), or solved exactly using computer programs in known ways. The configuration of FIG. 9B leads to a positive value of ë. Another aspect of the present invention enables a negative value of ë to be attended, thereby providing greater choices to a designer in attaining desired filter characteristics as described below with reference to FIG. 9C

Figure 9C:
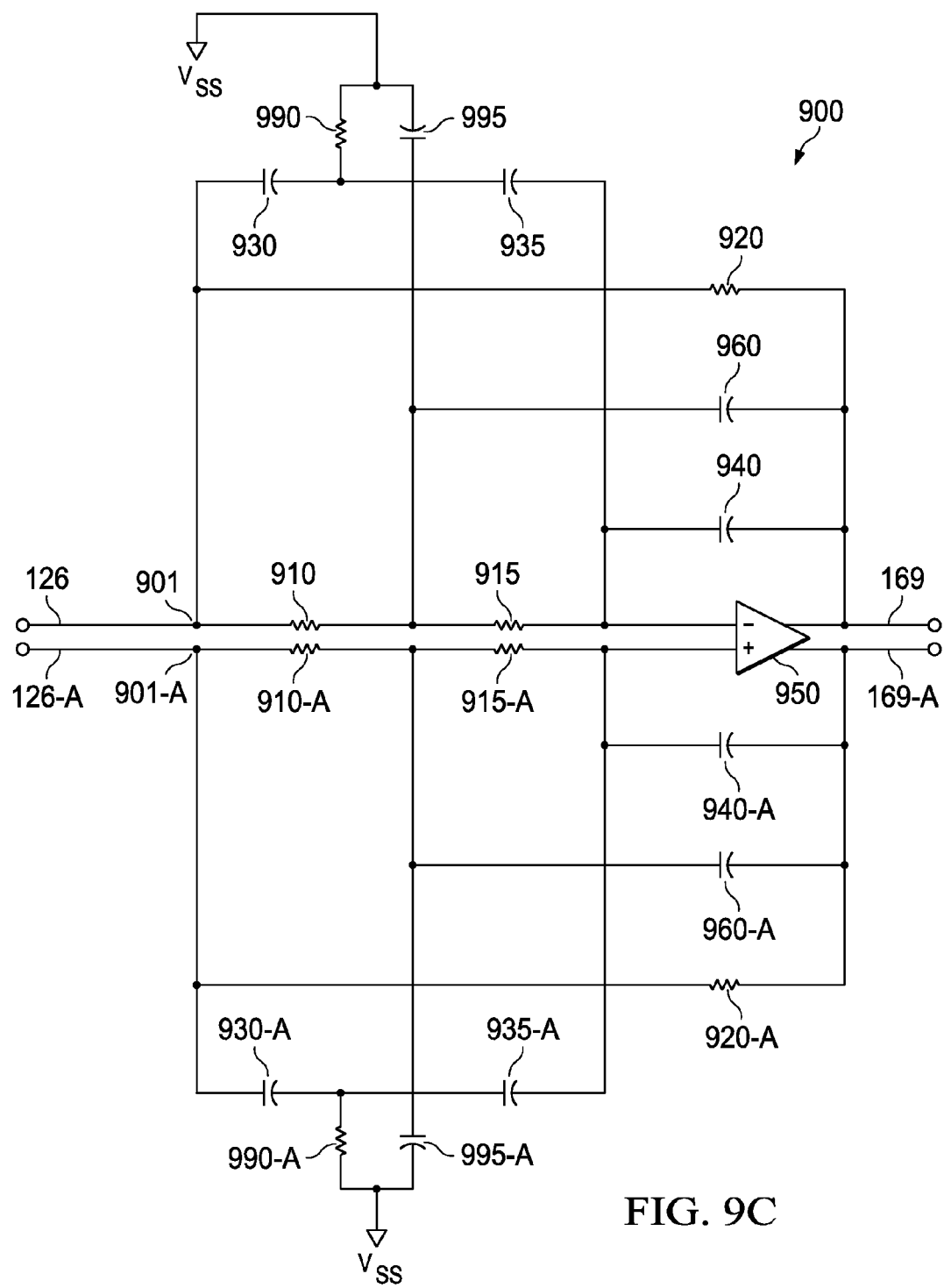
FIG. 9C is a circuit illustrating a modification to the differential circuit of FIG. 9B which provides a designer more design choices in achieving desired filter characteristics.

FIG. 9C is similar to FIG. 9B except that a terminal of capacitor 960 is connected to non-inverting output terminal 169-A (instead of inverting output terminal 169 as in FIG. 9B) and the terminal of capacitor 960-A is connected to inverting output terminal 169. Due to such a configuration, a negative value for ë is attended, as would be apparent to one skilled in the relevant arts.

In auction, if ë=0 (removing capacitor 960 from FIG. 9A), as topology 930/935 and resistors 990/910 are removed, the topology of FIG. 9A (9B) reduces to the topology of FIG. 6A (9B) (with an extra capacitor), consistent with the statement that the circuit of FIG. 9A (9B and 9C) represents a general topology from which the topology of FIG. 6A can be derived.

Also, the topologies of FIG. 6A and FIG. 9A (9B and 9C) operate as ideal trans-impedance configurations at low frequency of input signals. In addition, it may be observed from FIG. 7 that the input impedance exhibits a band-pass transfer function at high frequencies, which pecks at the corner frequency (701) of the filter.

To provide ideal trans-impedance configuration, the input impedance of the filter has to be low even at high frequencies. The desired low input impedance may be obtained by reducing the ratio of the resistance values of resistors 610 to 620 in filter circuit 600 of FIG. 6, and reducing the ratio of the resistance value of resistors 910 and 915 to 920 in filter circuit 900 of FIG. 9. However, such reduction in ratios would cause a correspondingly reduce feedback factor, as may be appreciated from the below equations (8) and (9), that are presented only for filter circuit 600. As is well known, feedback factor of an operational amplifier is defined as the percentage of signal that is fed back in the negative feedback configuration. A reduced feedback factor reduces the effective bandwidth of the op-amp, which makes the circuit more sensitive to op-amp non-idedities.

The input impedance of filter circuit 600 is given by Equation (8):

$$Z_{in} = \frac{(sC_2R)R_f}{1+sC_2\cdot(R_f+R)+s^2\cdot C_1C_2R_fR} \quad \text{Equation (8)}$$

The feedback factor of filter circuit 600 is given by Equation (9):

$$\frac{1}{\beta} = 1 + \frac{sR_fC_1}{1+sC_2\cdot(R_f+R)+s^2\cdot C_1C_2R_fR} \quad \text{Equation (9)}$$

By serving Equations (8) an (9), it can be appreciated that the input impedance and feedback factor of filter circuit 600 follows a band-pass transfer function. The maximum values of these parameters are present at the corner frequency, as given by the below equations 10 (for input impedance) and 11 (feedback factor):

$$Z_{in}|_{max} = (R \parallel R_f) \quad \text{Equation (10)}$$

$$\frac{1}{\beta}\Big|_{max} = 1 + Q^2\left(1+\frac{R_f}{R}\right) \quad \text{Equation (11)}$$

By examining FIG. 6, it may be noted that the trans-impedance of the circuit is determined by resistor 620. But the input impedance is determined by the parallel combination of resistor 620 and 610, as noted in equation (10) above. Thus, for a given trans-impedance, to reduce the input impedance resistor 610 should be reduced. However, such a reduction in the resistance value of resistor 610 would result in decreased feedback factor, as seen from equation (11). This is an undesirable effect.

Figure 10:
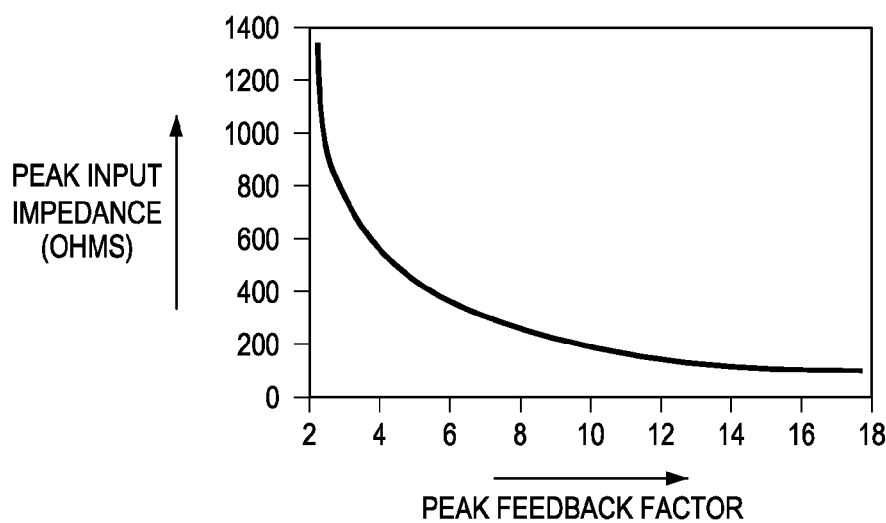
FIG. 10 is a graph illustrating the feedback factor values corresponding to various input impedance values in one embodiment.

FIG. 10 illustrates the feedback factor values (Y-axis) for corresponding input impedance values (X-avis) in one embodiment. It may be generally observed that the feedback factor reduces with a reduction of the input impedance value. However, it is generally desirable to have a high feet factor and low input impedance. Thus, depending on the requirements of the specific situation, a compromise needs to be attained between the conflicting requirements, and a designer may choose corresponding parameter values.

From the cove, it may be appreciated that, filter circuits of FIGS. 5A, 5B, 6A, 6B and 9 provide low input impedance, which is desirable for current mode interface. As a result of the current mode interface between mixer 120 and filter circuit 160, the need for large voltage swing on path 126 is eliminated, which results in improved linearity (reduced distortion). In addition, due to the current mode interface to filter circuits of FIGS. 5A, 5B, 6A, 6B, and 9 the need for some resistors is eliminated, which results in reduction in noise in the signals of interest.

12. Conclusion

While various embodiments of the present invention have been described above, it should be understood that they have been presented by way of example only, and not limitation. Thus, the breath and scope of the present invention should not be limited by may of the above described exemplary embodiments, but should be defined only in accordance with the following claims and their equivalents.

What is claimed is:

1. A trans_impedance filter circuit processing an input signal and generating an output signal, said trans_impedance filter circuit comprising:
    an operational amplifier having an inverting input terminal, a non_inverting input terminal and an output path;
    a first resistor having one terminal coupled to receive said input signal, and another terminal being coupled to said inverting input terminal;
    a first capacitor being coupled between said one terminal of said first resistor and a first constant bias;
    a second resistor connected between a first node and said output path, wherein said first node is in a path said input signal is provided to said inverting input terminal; and
    a second capacitor connected between said inverting input terminal and said output path; further comprising:
    a third resistor connected in series with said first resistor at a second node, wherein said another terminal of said third resistor is connected to receive said input signal at said first node;

a third capacitor and a fourth capacitor connected in series between said first node and said inverting input terminal, said third capacitor being connected to said fourth capacitor at a third node; and a fourth resistor being connected between said third node and a third constant bias.

2. The trans impedance filter circuit of claim 1, further comprising a fifth capacitor connected between said output path and said second node.

3. The trans_impedance filter circuit of claim 2, wherein said first capacitor has a capacitor of 2 kC(1-ë) said fifth capacitor has a capacitance of 2 kCë and said fourth resistor has a resistance equaling kR/2, wherein C represents the capacitance of each of said third capacitor and said fourth capacitor, R represents the resistance of said first resistor, k and ë are variables which can be set by a designer to attain desired filter characteristics.

4. The trans_impedance filter circuit of claim 3, wherein said trans_impedance filter circuit is implemented in a differential mode, and said output path comprises an inverting output terminal and a non_inverting output terminal.

5. The trans_impedance filter circuit of claim 4, wherein said fifth capacitor is connected between said second node and said non_inverting output terminal to attain a positive value for said ë.

6. The trans_impedance filter circuit of claim 4, wherein said fifth capacitor is connected between said second node and said inverting output terminal to attain a negative value for said ë.

7. A device comprising:

a trans_impedance filter circuit processing an input signal and generating an output signal, said trans_impedance filter circuit comprising:

an operational amplifier having an inverting input terminal, a non_inverting input terminal and an output path, said output path providing said output signal;

a first resistor having one terminal coupled to receive said input signal, and another terminal being coupled to said inverting input terminal;

a first capacitor being coupled between said one terminal of said first resistor and a first constant bias;

a second resistor connected between a first node and said output path, wherein said first node is in a path said input signal is provided to said inverting input terminal; and a second capacitor connected between said inverting input terminal and said output path; and an analog to digital converter coupled to said output path, and sampling said output signal to generate a plurality of digital samples; further comprising:

a third resistor connected in series with said first resistor at a second node, wherein said another terminal of said third resistor is connected to receive said input signal at said first node;

a third capacitor and a fourth capacitor connected in series between said first node and said inverting input terminal, said third capacitor being connected to said fourth capacitor at a third node; and a fourth resistor being connected between said third node and a third constant bias.

8. The device of claim 7, further comprising a fifth capacitor connected between said output path and said second node.

9. The device of claim 8, wherein said first capacitor has a capacitance of 2 kC(1-ë) said fifth capacitor has a capacitance of 2 kCë and said fourth resistor has a resistance equaling kR/2, wherein C represents the capacitance of each of said third capacitor and said fourth capacitor, R represents the resistance of said first resistor, k and ë are variables which can be set by a designer to attain desired filter characteristics.

10. The device of claim 9, wherein said trans_impedence filter circuit is implemented in a differential mode, and said output path comprises an inverting output terminal and a non_inverting output terminal.

11. The device of claim 10, wherein said fifth capacitor is connected between said second node and said non_inverting output terminal to attain a positive value for said ë.

12. The device of claim 10, wherein said fifth capacitor is connected between said second node and said inverting output terminal to attain a negative value for said ë.

13. The device of claim 7, further comprising:

a low noise amplifier receiving an external signal at a carrier frequency and generating an amplified signal; and a mixer down-converting said amplified signal to generate said input signal with the frequency band of interest being centered at a lower frequency than the carrier frequency.

* * * * *